United States Patent
Wolters et al.

(10) Patent No.: US 9,431,553 B2
(45) Date of Patent: Aug. 30, 2016

(54) PROTECTIVE COVER FOR A COPPER CONTAINING CONDUCTOR

(71) Applicant: M4SI B.V., Waalre (NL)

(72) Inventors: Robertus Adrianus Maria Wolters, Eindhoven (NL); Johannes Reinder Marc Luchies, Waalre (NL); Klaas Heres, Berkel en Rodenrijs (NL)

(73) Assignee: M4SI B.V. (NL)

( * ) Notice: Subject to any disclaimer, the term of this patent is extended or adjusted under 35 U.S.C. 154(b) by 0 days.

(21) Appl. No.: 14/440,830

(22) PCT Filed: Nov. 5, 2013

(86) PCT No.: PCT/NL2013/050789
§ 371 (c)(1),
(2) Date: May 5, 2015

(87) PCT Pub. No.: WO2014/070019
PCT Pub. Date: May 8, 2014

(65) Prior Publication Data
US 2015/0295103 A1  Oct. 15, 2015

(30) Foreign Application Priority Data
Nov. 5, 2012  (NL) ..................................... 2009754

(51) Int. Cl.
*H01L 31/0224*  (2006.01)
*H01L 31/0216*  (2014.01)
(Continued)

(52) U.S. Cl.
CPC . *H01L 31/022425* (2013.01); *H01L 31/02167* (2013.01); *H01L 31/048* (2013.01); *H01L 31/18* (2013.01); *Y02E 10/50* (2013.01)

(58) Field of Classification Search
CPC ........... H01L 31/022425; H01L 31/50; H01L 31/02167; H01L 31/048; H01L 31/18
USPC ........................................................ 136/256
See application file for complete search history.

(56) References Cited

U.S. PATENT DOCUMENTS 5,082,791 A    1/1992  Micheels et al.
7,863,203 B2   1/2011  Wang et al.
(Continued)

FOREIGN PATENT DOCUMENTS

DE    102007031958 A1   1/2009
GB        2467360 A     8/2010
NL        2009382 A     3/2014

OTHER PUBLICATIONS

International Search Report and Written Opinion mailed Jan. 27, 2014 (PCT/NL2013/050789); ISA/EP.
(Continued)

*Primary Examiner* — Jayne Mershon
(74) *Attorney, Agent, or Firm* — Banner & Witcoff, Ltd.

(57) ABSTRACT

The method of manufacturing a solar cell comprises the steps of: (a) providing the semiconductor substrate in a deposition chamber of a vapour deposition apparatus, which semiconductor substrate comprises a passivation layer at a first side thereof which passivation layer is patterned to define contact areas at which the copper-containing conductor is present; (b) supplying a gaseous silicon species into the deposition chamber, resulting in the formation of a surface layer of a copper silicide on a surface of the copper-containing conductor and in the formation of amorphous silicon on top of the passivation layer, and (c) providing a protective layer of an insulating silicon compound on the surface layer, wherein the protective cover comprising both the surface layer and the protective layer.

20 Claims, 2 Drawing Sheets

(51) Int. Cl.
*H01L 31/048* (2014.01)
*H01L 31/18* (2006.01)

(56) References Cited

U.S. PATENT DOCUMENTS

| | | |
|---|---|---|
| 2007/0108404 A1 | 5/2007 | Stewart et al. |
| 2010/0181670 A1 | 7/2010 | Krause et al. |
| 2011/0041911 A1 | 2/2011 | Lee et al. |
| 2011/0272009 A1 | 11/2011 | Cabral, Jr. et al. |
| 2012/0060917 A1* | 3/2012 | Jin .................. H01L 31/022433 136/256 |

OTHER PUBLICATIONS

Hymes S et al: "Passivation of Copper by Silicide Formation in Dilute Silane", Advanced Metallization for USLI Applications 1991 Proceedings of the Conference, Oct. 28-30, 1991, Tempe, AZ, Pittsburgh, PA, US, Jan. 1, 1992, pp. 425-431, XP000605637.

Hymes S et al: "Thermal stability of copper silicide passivation layers in copper-based multilevel interconnects", Journal of Applied Physics, American Institute of Physics. New York, US, vol. 83, No. 8, Apr. 15, 1998, pp. 4507-4512, XP012045059, ISSN: 0021-8979, DOI: 10.1063/1.367235.

* cited by examiner

PROTECTIVE COVER FOR A COPPER CONTAINING CONDUCTOR

The application is a U.S. National Phase Entry of International Application No. PCT/NL2013/050789 filed on Nov. 5, 2013, designating the United States of America and claiming priority to Dutch Patent Application No. 2009754 filed on Nov. 5, 2012. The present application claims priority to and the benefit of the above-identified applications and the above-identified applications are incorporated by reference herein in their entirety.

FIELD OF THE INVENTION

The invention relates to a method of manufacturing a solar cell with a copper-containing conductor covered with a protective cover, comprising the steps of: depositing the copper-containing conductor on a substrate, and providing the protective cover on an exposed surface of the conductor.

The invention further relates to an electronic device thus obtainable.

BACKGROUND OF THE INVENTION

Solar cells need conductors for electrical connection of electrodes in the substrate to terminals. Typically, the electrodes are defined as highly doped regions in the semiconductor substrate. After passivation of the semiconductor substrate, such passivation layer is locally opened and a conductor is applied locally.

Generally, two methods of conductor deposition on solar cells are available: the use of a screen printed metal paste and the use of electroplating, particularly with copper. A metal paste has a composition for local removal of any underlying insulating and/or passivation layer, such as silicon oxide and silicon nitride. Disadvantages of the use of such metal paste include its limited conductivity, the large area needed and a high price. Copper-containing conductors are well-known in the art of semiconductor device manufacturing and printed circuit board manufacturing. Such copper-containing conductors may contain pure copper or a copper alloy and are suitably manufactured by means of an electrochemical process, more particularly a plating process. The advantage of such copper-containing conductors in comparison to other conductors is the low resistivity of copper.

A disadvantage of such copper-containing conductors is that copper has a tendency to migrate, which may cause malfunctioning. The migration is particularly problematic in the presence of semiconductor substrates, such as silicon substrates. Therefore, copper-containing conductors need to be isolated through so-called diffusion barriers. The application of diffusion barriers and copper-containing conductors has been developed for interconnect structures of integrated circuits and is known as damascene and double damascene processes. These damascene processes require plurality of lithographical steps, which result in a high cost price, and are therefore specific to the application in integrated circuits.

In solar cells the use of copper containing conductors is less widespread, even though the low cost price of electrochemical processes fits such applications. There is however a second disadvantage in using copper that needs to be overcome, which is a protection of copper-containing conductors against corrosion and oxidation, leading f.i. to increased resistance of the conductors, failures due to open circuits and poor contacts to any underlying substrate, such as a semiconductor substrate.

It is known to protect the copper-containing conductor in solar cells with a protective cover in the form of either an organic surface protection (known as OSP), a tin (Sn) cover layer, or an additional Ni-based layer and a thin silver (Ag) or gold (Au) cover layer. These known protective covers suffer from either only short-term protection (OSP) or high material and processing costs (Sn, Ni—Au).

SUMMARY OF THE INVENTION

It is therefore an object of the invention to provide an improved method of manufacturing of a solar cell comprising a copper-containing conductor with a protective cover on a semiconductor substrate, and to devices thus obtained.

According to a first aspect of the invention, a method of manufacturing a solar cell comprising a copper-containing conductor covered with a protective cover on a semiconductor substrate is provided. The method comprises the steps of:

Providing the semiconductor substrate in a deposition chamber of a vapour deposition apparatus, which semiconductor substrate comprises a passivation layer at a first side thereof, which passivation layer is patterned to define contact areas at which the copper-containing conductor is present;

Supplying a gaseous silicon species into the deposition chamber, resulting in the formation of a surface layer of a copper silicide on a surface of the copper-containing conductor and in the formation of amorphous silicon on top of the passivation layer, and Providing a protective layer of an insulating silicon compound on the surface layer, wherein the protective cover comprising both the surface layer and the protective layer.

According to a second aspect of the invention, a solar cell is provided. The solar cell of the invention comprises a semiconductor substrate provided with a passivation layer at a first side thereof, which passivation layer is patterned to define contact areas provided with a copper-containing conductor, which conductor is covered with a protective cover, which protective cover comprises a surface layer of a copper silicide and a protective layer of an insulating silicon compound.

The use of a copper silicide as a surface layer in the invention, covered with a protective layer of an insulating silicon compound, results in a good surface protection. It is very well suitable for the provision of copper-containing conductors in solar cells, wherein a primary conductor typically connects the substrate surface to a contact or through-substrate via over a significant lateral distance. Herein, a good protection is more important than the ability of reopening the protective cover at many locations at high resolution, such as in integrated circuit manufacture. Moreover, the mentioned applications often require a low temperature process and this can be met with the present invention.

More fundamentally, the surface layer and the protective layer have a separate function in the invention. The surface layer ensures the lateral extension of a stable bond across the surface; the protective layer provides the protection function in the form of a closed coating that is corrosion-resistant.

The inventors have understood, in investigations leading to the invention, that the copper-silicide surface layer remains on the surface of the copper-containing conductor.

In fact, it is understood that the copper from the conductor will diffuse into the silicon deposited on the surface, rather than the opposite, notwithstanding the much bigger amount of copper atoms relative to silicon atoms. As a result, the copper-silicide will be formed as a surface layer, rather than a dispersion of the silicon atoms. A further consequence hereof is that the copper-silicide will be formed also, when further elements such as zinc, nickel or the like would be present in the copper-containing conductor; the nobility of the copper makes that it preferably forms an alloy with the silicon.

More particularly, the inventors have understood that this protection comprising a copper silicide may be generated maskless. Although the gaseous silicon species will also be deposited on top of the passivation layer present around the copper-containing conductor, it will thereon result in the formation of amorphous silicon. This amorphous silicon as deposited by chemical vapour deposition has a low electrical conductivity. Moreover, at the suitable low deposition temperatures and relatively short deposition times intended for the invention, there is substantially no conversion into a polysilicon layer. Beyond that, when provided the insulating silicon compound, such as a nitride or particularly oxide, the amorphous silicon will be at least partially converted into silicon nitride or silicon oxide. Therewith, the formation of a conductive layer between individual copper-containing conductors that could act as a leakage path is prevented. Moreover, the resulting layer is optically transparent and does not have a negative impact on optical transmission of irradiation into the substrate.

In one embodiment, hydrogen is added into the deposition chamber together with the silane. This addition results in reduction of the copper oxide surface layer. It further results in the formation of hydrogenated amorphous silicon. When increasing the deposition temperatures from 100 to 400° C., the incorporation of hydrogen decreases from approximately 50 at % to 10 at %. Around 300° C., the incorporation of hydrogen is about 30 at %. This results in a relatively open structure of the amorphous silicon, which again limits the electrical conductivity.

In one embodiment, the amorphous silicon is deposited directly on the passivation layer. In an alternative embodiment, the amorphous silicon is deposited on a structure of electrically insulating material, particularly of polymer material, which is used as a mask, and defines a cavity into which the copper-containing conductor may be defined. More particularly, such a structure may be an optically transparent structure, which does not need to be removed separately, as has been described in the non-pre-published Dutch patent application NL2009382, which is herein included by reference. The amorphous silicon does not limit the optical transmission thereof.

In a preferred embodiment, the gaseous silicon compound is a silane compound, such as silane ($SiH_4$), disilane ($Si_2H_6$) or trisilane ($Si_3H_8$). Particularly disilane and more preferably trisilane, also known as Silcore, turns out very suitable. It provides a relatively high deposition rate at lower temperatures. A further advantage of silanes is their reducing properties, so that any preceding reduction of the surface of the conductor, to remove any oxide, is not necessary. However, such preceding reduction may be done separately. Preferably, use is made of a diluted silane gas composition, comprising less than 10% silane, or also at most 5% silane.

In a further embodiment, the protective cover is formed at a temperature in the range of 100-300° C., preferably 150-250° C. Formation at such a low silicidation temperature results in creation of a thin surface layer of copper silicide. The protective cover is for instance provided in a thickness of less than 20 nanometer, for instance at most 10 nanometers, preferably up to 5 nm. A foreseen minimum thickness resides in a minimum thickness of the protective layer of 2-3 nm, and a minimum copper silicide layer of for instance 1 nm. A low temperature process is highly beneficial for products with one or more temperature sensitive layers, i.e. a junction in a solar cell, polymer carriers in circuit boards and/or in flexible devices, biologically sensitive layers in biosensors, functional layers in displays and the like. While in integrated circuit manufacture a low-temperature silicide is undesired, as it typically is a silicide phase with a high resistivity, this does not matter for the present use in a protective cover.

In one embodiment that is advantageously embodied as a silane based low temperature process, and particularly with a comparatively fast decomposing silane species, such as trisilane, preferably at a medium temperature, such as for instance between 180 and 280° C., the silane species is provided to create an excess silicon. This excess silicon is thus a silicon layer on top of the copper-silicide. The excess silicon may thereafter be fully converted into the insulating silicon compound, particularly silicon oxide, and more particularly a native silicon oxide.

Alternatively, some excess silicon may be left over. The protective cover then comprises the surface layer, the excess silicon and the protective layer. This embodiment has the benefit of an inherent re-sealing of the protective cover. The occurrence of cracks into the protective layer can never be ruled out, particularly with devices with a long lifetime, such as solar cells. However, when such cracks are created, underlying excess silicon will be exposed locally in the cracks. This exposed excess silicon will oxidize in situ to form a new local portion of the protective layer.

Particularly, such excess silicon film is formed at low temperatures, i.e. up to 300° C., and selectively with respect to the silicon formation on the passivation layer. The inventors believe, without desiring to be bound herewith, that the copper silicide is a more preferable substrate for silicon deposition than the passivation layer, leading to a higher deposition rate.

In a preferred embodiment, the method comprises the step of reducing an oxide surface of the copper containing conductor to obtain an exposed surface of the conductor. This step is more preferably implemented through supply of hydrogen into the deposition chamber, for instance in the form of molecular hydrogen, an atomic hydrogen source or as atomic hydrogen. The supply occurs either prior to or simultaneous with the supply of the gaseous silicon compound, hence minimizing process steps.

Preferably, the surface exposure and deposition step is carried out as a plasma-enhanced or plasma assisted deposition process to enhance the reactivity and the deposition rate of Si. Examples of deposition processes are particularly (plasma assisted) atomic layer deposition (ALD) or (plasma enhanced) chemical vapour deposition (PECVD). Various types of implementation of such PECVD process are deemed applicable, such as ICP, TCP, ECR. Light induced and pulsed laser deposition processes can also be used for this treatment.

The copper-silicide is an alloy. In view of its presence as a surface layer, inherently thin, it does not appear appropriate to refer to the formation of any specific crystalline copper-silicide phase. Rather, it appears to be a mixture, likely amorphous, with a composition of presumably not more than 24 at % of Si, such as a $Cu_4$—Si alloy. (Local) deviations of such a stoichiometry are by no means excluded.

The copper-silicide could contain a further noble metal, such as gold (Au), platinum (Pt), palladium (Pd) or the like. Such noble metals could be applied as a flash on top of the copper-containing conductor. These are particularly known as a finish for subsequent soldering processes.

In a further embodiment, the protective layer could be patterned, or more preferably be applied in a patterned manner. Since its application is suitably a low-temperature process, there is a plurality of suitable masks that are stable during the process. Such mask could for instance be applied to define a solder pad or bond pad. The mask could be applied in a printing process, such as inkjet printing, screen-printing or soft lithography.

Suitably, the insulating silicon compound is a silicon oxide. This can be formed by exposure to ambient atmosphere, also known as the formation of a native silicon oxide. Alternatively, the insulating silicon compound is a silicon nitride, a silicon oxynitride that can be formed by a subsequent treatment in N NH3 O containing plasma immediately after the Si treatment without breaking vacuum. However, this results in an additional step and is therefore not preferred.

The formation of the protective cover in the invention may be carried out subsequent to the formation of the copper-containing conductor on the substrate. This formation may comprise the formation of an interface layer and the deposition of the conductor thereon. The formation of such an interface layer is particularly suitable on top of a semiconductor substrate, such as a silicon substrate, into which copper easily migrates. The combination of the formation of the conductor and the protective cover is however not essential. The low formation temperature may herein be further exploited in order to prevent the formation of a metal silicide between the interface layer and the silicon substrate. Such a metal silicide is generally undesired, as it would increase the contact resistance to a doped substrate region defining for instance an emitter. However, metal silicides, such as nickel silicides and palladium silicides may already be formed at temperatures of 300° C. Silicide formation will consume underlying silicon. This can lead to junction leakage and shortage and this is unwanted.

In one embodiment, the interface layer comprises a metal that is silicidized prior to deposition of the copper-containing conductor. The temperature is then preferably kept low so as to prevent silicide growth that could harm any junction in the substrate near to the substrate surface. However, such metal silicide is not an appropriate diffusion barrier against diffusion of copper into silicon. Evidently, the interface layer may have a larger thickness or contain a second sublayer of different material, but this adds to cost and complexity. Alternatively and preferably, the provision of the interface layer and the formation of the copper silicide are carried out such that formation of a metal silicide with the silicon substrate is at least largely prevented.

Suitably, the interface layer constitutes a plating base and the copper-containing conductor is deposited in an electrochemical process. This results in a low-cost process that is robust, suitable for creation of conductors of sufficient height and thickness to provide low resistance. Furthermore, the electrochemical process is a low-temperature process, which may be carried out at room temperature, but also at 80° C. or any intermediate temperature. In a further embodiment, the exposed surface extends on a top face of the conductor as well as to a side face hereof. This extension on both top face and side face, in combination with the presence of the interface layer acting as a diffusion barrier, results therein that the copper is essentially hermetically encapsulated. Therewith an optimum protection against diffusion of copper species into other layers and particularly the silicon substrate is prevented.

BRIEF INTRODUCTION OF THE FIGURES

These and other aspects of the invention will be further elucidated with reference to the figures in which.

DETAILED DISCUSSION OF ILLUSTRATIVE EMBODIMENT

Figure 1:
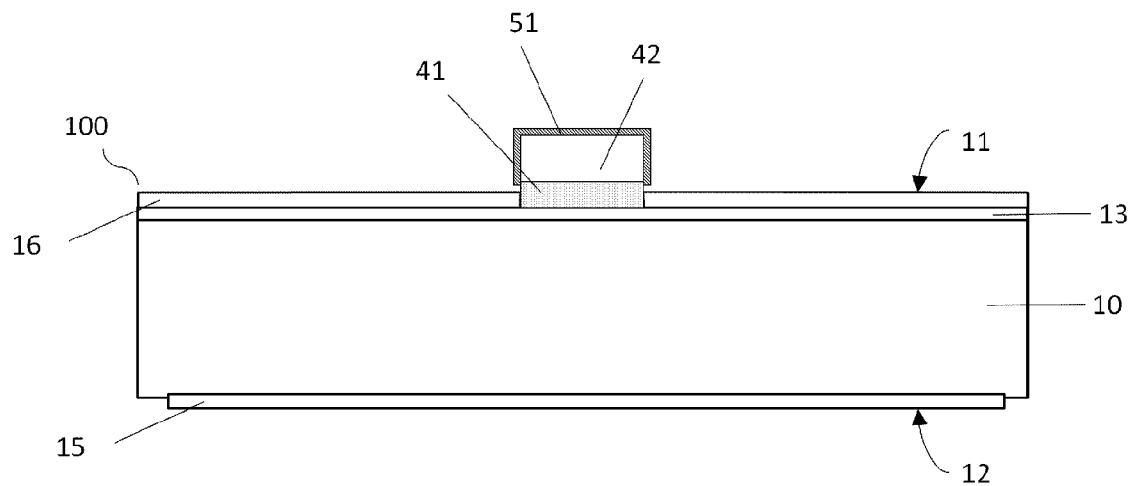
FIG. 1 shows in a cross-sectional, diagrammatical view an electronic device according to a first embodiment of the invention, which is in this example a solar cell.

The Figures are not drawn to scale and merely intended for illustrative purposes. Equal reference numerals in different figures refer to like or equal parts.

FIG. 1 shows in a cross-sectional, diagrammatical view an electronic device in accordance with the invention, which is in this example a solar cell with a semiconductor substrate 10 with a front side 11 and a rear side 12. The front side is the side that is intended as main side for receiving irradiation during use; the solar cell will be assembled on its rear side 12 to a carrier. It typically has been texturized in advance of doping processes. The semiconductor substrate 10 of this example is a mono-crystalline silicon substrate. While silicon substrates constitute the best available compromise between manufacturing costs and quality, it is not excluded that alternative substrates are used. Such alternative substrates could be made of III-V materials, but more likely incorporate one or more layers of a different material, such as a III-V material, or SiGe, SiC and the like as known to the skilled person. The semiconductor substrate is doped with a dopant of the first conductivity type, which is in the preferred example n-type. The doping concentration is moderate, for instance 10exp16 /cm3. The semiconductor substrate 10 is provided at the rear side 12 with a region of n+-doped material 13. Suitably, use is made of phosphorous doping in a manner known to the skilled person, for instance by vapor deposition. Dopant species of a second type, in this case p+ type, is applied by diffusion to the front side 11. The Boron diffusion source may be a vapour source or a coating source. In the oven the substrate is heated for a certain period of time and to a certain temperature so as to diffuse Boron into the front side of the substrate 10, and create emitter regions. Simultaneously, the phosphorous doping at the rear side 12 of the substrate 10 is diffused as well, so as to create a double-diffused field region. At a rear or second side 12 a back contact (15) is present, for instance comprising aluminium.

A passivation layer 16 is applied on the front side 11 and may further be present on the rear side 12. The passivation layer suitably comprises SiN, as known to the skilled person, but alternative materials are by no means excluded. It goes without saying that the passivation layers 16 could be applied in separate steps and then do not need to have identical composition.

Instead of applying a nitride passivation layer, stacks of amorphous silicon layers may be deposited on the front side 11 and optionally on the rear side 12. These amorphous silicon layers are suitably deposited by Plasma enhanced chemical vapour deposition (PECVD), for instance in a parallel plate plasma deposition driven by a 13.5 MHz power source, or in an inductively coupled plasma PECVD set up. The thickness of amorphous silicon layers is suitably 20 nm or less, more preferably 10 nm or less. The stacks comprise an intrinsic layer and a p-doped layer on the front side 11, and an intrinsic layer and a n-doped layer at the rear side 12. It has turned out that such amorphous silicon layers not only act as passivation layers, but also result in silicon heterojunction solar cells.

Copper-containing conductors 41,42 connect selected doped regions in the substrate 10 to terminals. According to one major embodiment of the invention, the conductors, at least those on the front side 11 of the substrate are deposited electrochemically, for instance with electroplating. This occurs suitably by deposition within a cavity of a mask of insulating material.

The copper-containing conductor 41, 42 suitably comprises an intermediate interface layer 41 that is present on the emitter region in the substrate 10, and a conductor 42. Such interface layer 41 is intended for the prevention of any undesired contamination, and so as to act as a plating base for the electroplated conductor 42. The interface layer 41 may contain one or more sublayers, suitably of metal or an alloy or any other conductive material. Use could be made of one or more metals selected from the group of nickel (Ni), cobalt (Co), polysilicon, titanium (Ti), tantalum (Ta), rhenium (Rh), molybdenum (Mo), tungsten (W), palladium (Pd), platinum (Pt) ruthenium (Ru), titanium nitride (TiN), tungsten nitride (WN), titanium tungsten nitride (TiWN), silver (Ag) and any alloys therewith. It is desirable to select a deposition process and a metal that forms a good electrical contact, or ohmic contact, between the doped silicon region (e.g., n-type region 13) and the deposited interface layer. Thereto, the metal of the interface layer 41 may be silicidized with the underlying substrate 10, in a manner so as to form a silicide with a sufficiently low resistance, as is well known in the art.

The interface layer (41) is present within an aperture in the passivation layer (16), such that the passivation layer is located circumferentially to the interface layer (41). A copper-containing conductor (42) is deposited on top of the interface layer (41).

An example of electroless deposition process that may be used to grow the interface layer 41 on a doped silicon region is further described in the U.S. patent application 2007/0108404 A1 which is incorporated by reference herein in its entirety. In another embodiment, the interface layer may be selectively formed by use of an inkjet, rubber stamping, or any technique for the pattern wise deposition (i.e., printing) of a metal containing liquid or colloidal media on the surface of the substrate. After depositing the metal containing liquid or colloidal media on the surface of the substrate it is generally desirable to subsequently perform a thermal post treatment to remove any solvent and promote adhesion of the metal to the substrate surface. Particularly, the use of inkjet printing appears suitable in case of deposition within a cavity. Here, the inkjet could further be used as a seed on top of which the interface layer is grown, for instance by electroplating or electroless methods.

The conductor 42 of the copper-containing conductor is suitably deposited in an electrochemical way, such as with an electroless deposition or electroplating. Typically, the conductor 42 substantially consists of copper, as directly resulting from the deposition process, and because pure copper has a lower electrical resistivity than alloys. However, the use of an alloy is not excluded. It will be understood by the skilled person that contaminants could be present in the conductor 42. It will further be understood that the conductor 42 may comprise a comparatively thin top layer of a different material, such as gold, palladium, also known as a flash. During formation of the conductor 42, a mask is suitably used, so as to obtain the conductor in a desired shape of sufficient height and limited width. The copper of the conductor 42 will form a copper oxide shell by itself, which is however not suitable as a corrosion protection.

In accordance with the invention a protective cover 51 is applied, comprising a surface layer and a protective layer. An intermediate excess layer may be present between the surface layer and the protective layer. The surface layer comprises a Cu—Si-compound, also known as a copper silicide. The excess layer, if any, comprises metallic silicon. The protective layer comprises an insulating silicon compound, which is suitably silicon oxide, and more suitably a so-called native oxide, as formed upon exposure of the bare silicon to an oxygen containing atmosphere such as air. The excess layer suitably comprises pure silicon. However, the silicon could be mixed with another element, such as for instance germanium.

The copper silicide forms a coating at the surface, i.e. a surface layer. This coating is believed to be amorphous, or at least not to have a specific crystalline phase known from the phase diagram of Cu—Si. Generally, copper silicides contain at most 24 at % Si. The amount formed depends on the formation process as well as further thermal treatments. In view thereof that the copper-silicide acts as a surface layer laterally extending on the conductor 42 and bonding the conductor 42 to any protective layer of the insulating silicon compound, the exact composition is not deemed to matter. If any contaminants with less nobility than copper would be present in the conductor 42, these are not integrated into the copper silicide, as copper will diffuse preferentially to the silicon and preferentially forms the silicide. If other noble metals such as gold would be present at the surface of the conductor 42, the copper silicide may further contain said other noble metal. Simultaneously with the provision of the copper silicide surface layer, amorphous silicon is deposited on top of the passivation layer, for instance based on hydrogenated and amorphous PECVD silicon nitride, typically applied for solar cells. Due to the low deposition temperature and the relative short deposition times, typically less than 5 minutes, and for instance up to 90 seconds, the amorphous silicon layer is believed to be a relatively open rather than a dense layer, and the resulting electrical conductivity very low. Effectively, the thus formed and undoped silicon, which may be hydrogenated, is a dielectric material.

Preferably, the substrate 10 with the conductor 42 is provided into a deposition chamber of a chemical vapour deposition apparatus per se known in the art. Thereafter, the temperature in the deposition chamber is increased to 100-300° C., for instance 150-250° C. The upper temperature also depends on the sensitivity of the substrate for heat treatments. In at least some solar cells, the junction is sensitive. Typically, a substrate can have a maximum temperature for a treatment and a maximum thermal budget for the various treatments together. If subsequently soldering is applied, which is a step with a relatively high temperature, for instance 280° C., it is preferred to set the temperature in the deposition chamber well below such soldering temperature.

In other to remove any copper oxide shell, a reducing treatment is preferably carried out. Thereto, a hydrogen reaction gas (for instance Ar and 3% $H_2$) is applied into the chamber. Even though the silane species preferably used thereafter is also reductive, the initial removal of the copper oxide is deemed beneficial for optimum process control. Subsequently, the reaction gas is modified to contain a silicon-compound, which is preferably a silane species as known per se. A suitable reaction gas is Ar/5% $SiH_4$ or Ar/3% $Si_3H_8$. This results in the formation of the copper-silicide and any excess silicon. The thickness of the copper silicide versus the thickness of the excess silicon depends on the ratios of the silane decomposition rate at the surface and the copper diffusion into the silicon. The use of $Si_3H_8$ will increase the formation of excess silicon, due to its provision of more silicon. Alternative silane species are known per se, f.i. from U.S. Pat. No. 7,863,203, which is herein included by reference.

Also the gas diffusion in the chamber has a positive effect on the decomposition rate. An increase in temperature increases the copper diffusion rate, and therewith the formation of the copper silicide. The low temperatures used in the invention in any case limit the formation to a surface layer rather than eating up the underlying conductor 42, which would give rise to any undesired increase in sheet resistance. Suitably, the silane decomposition rate is higher than the copper diffusion rate, so as to form an excess of silicon.

As will be seen in FIG. 1, the protective cover 51 extends on a top surface and on side faces of the conductor 42. This is suitably so as to encapsulate the conductor 42. It will be apparent that the protective cover 51 will merely extend on those areas that are exposed to the silane species.

Figure 2:
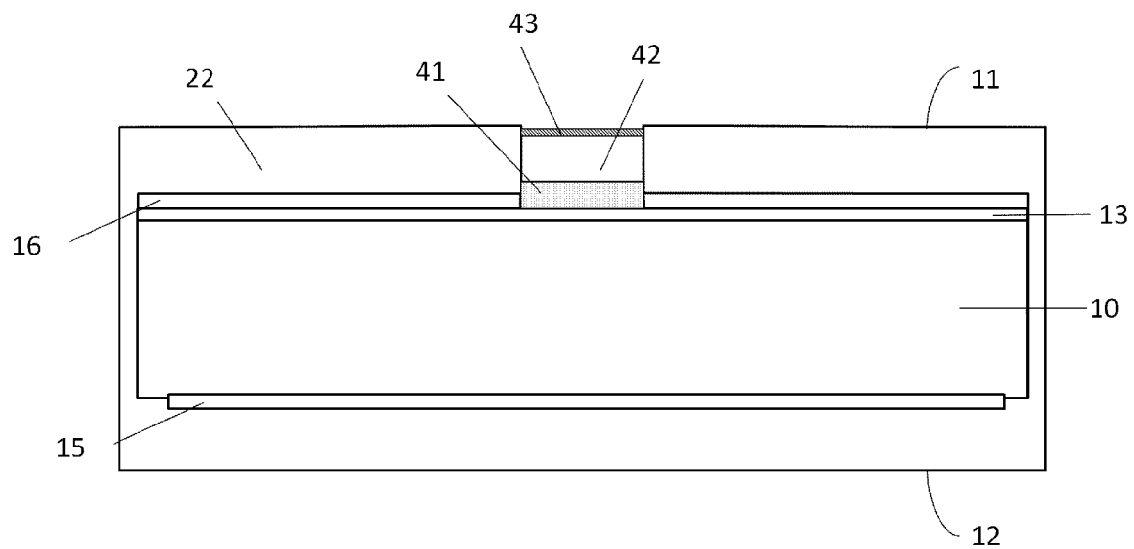
FIG. 2 shows in a cross-sectional, diagrammatical view an electronic device according to a second embodiment of the invention, which is in this example a solar cell.

Thereafter, a protective layer of an insulating silicon compound is formed. This is most suitably a native silicon oxide. This is suitably achieved by removal from the substrate out of the deposition chamber, or alternatively, the introduction of air into the deposition chamber. The native silicon oxide typically has a thickness in the order of 2-3 nm, for which it consumes partially any underlying excess and/or copper silicide. FIG. 2 shows a diagrammatical cross-sectional view of a second embodiment of the invention. In this embodiment, a front side 11 and the rear side 12 are covered with an insulating mask 22a, into which a cavity is present. This cavity is filled with the interface layer (41), the copper containing conductor (42). The insulating mask 22a effectively defines an exposed surface of the conductor (42), in the sense of limiting the surface that can be exposed by means of reduction of any native copper oxide. Thereafter, this surface is exposed, for instance by atomic hydrogen in a plasma treatment and subsequently the gaseous silicon compound is introduced, so as to obtain a surface layer and a protective layer, jointly constituting the protective cover.

Investigations have been made into a copper silicide protection in the early 1990s in the framework of integrated circuit development, since a silicide is commonly used as a contact layer on top of a polysilicon gate of a field effect transistor. Reference is made to S. Hymes et al, *J. Appl. Phys.* 71(1992), 4623-4625. Hymes et al report the formation of a copper silicide at temperatures from 300-350° C. by means of silane exposures. However, as stated on p. 4625 the 1 micron thick copper film is completely consumed and converted into a copper silicide. Hymes et al further investigate the change in resistivity upon annealing at higher temperatures in the range of 400-700° C., which is in line with the thermal budget that a copper silicide needs to meet during integrated manufacture after the gate silicidation. S. Hymes et al, *J. Appl. Phys.* 83(1998), 4507-4512 more particularly discusses the thermal stability of copper silicide passivation layers in copper-based multilevel interconnects within "ultralarge scale" integrated circuits. He concludes that one should not anneal silicided copper films to temperatures high enough to cause phase transitions in the copper silicide. This places a limit on silicided thickness larger than 3 nm for post-silicide applications at temperatures greater than 300° C. Overall, probably as a result of the Cu consumption and formation of high resistivity phases, a copper silicide has never been introduced in integrated circuit manufacture. Moreover, Hymes et al. does not disclose any teaching how to provide an appropriate protection on a patterned substrate, i.e. with local conductors rather than on a complete copper film.

Figure 3:
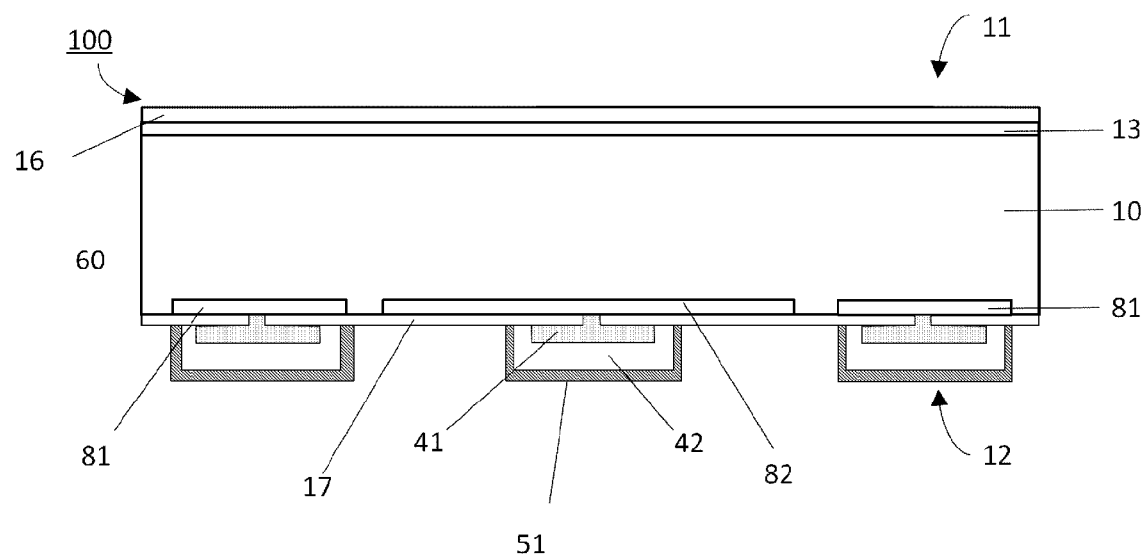
FIG. 3 shows in a cross-sectional, diagrammatical view an electronic device according to a third embodiment of the invention, which is in this example a solar cell.

FIG. 3 shows a diagrammatical cross-sectional view of a third embodiment of the invention. The shows device is again a solar cell, in this embodiment in an interdigitated back contact cell (IBC) design. A substrate 10 is provided with a front side 11 and a back side 12 having a front surface field 13 that may be textured and is covered with a passivation layer 16 that also serves as an anti-reflective coating. The back side has the emitter 82 and base 81 regions. In this case an n-type solar cell is concerned, which results in boron doped, p+ regions which form the emitter 82 and phosphorus doped n+ regions creating the base contact 81. Metal is contacting the emitter and base regions through small openings 60 of the back side passivation 17. The interface layer 41 is built up of a stack of metals, aluminium, tungsten-titanium stack. This stack provides good contact to the emitter and base regions and also serves as a barrier layer for the copper conductors 42. The copper conductor is covered by the protective cover 51 comprising a surface layer and the protective SiO2 layer . Also in this embodiment, the protective cover 51 encapsulates the conductor 42, both on a top face and on side faces. If desired, some areas on the copper conductor could be masked before the creation of the copper silicide surface layer, so as to leave those unprotected and ready for bonding or soldering.

The invention claimed is:

1. A method of manufacturing a solar cell comprising a copper-containing conductor covered with a protective cover on a semiconductor substrate, comprising the steps of:

Providing the semiconductor substrate in a deposition chamber of a vapour deposition apparatus, which semiconductor substrate comprises a passivation layer at a first side thereof, which passivation layer is patterned to define contact areas at which the copper-containing conductor is present;

Supplying a gaseous silicon species into the deposition chamber, resulting in the formation of a surface layer of a copper silicide on a surface of the copper-containing conductor and in the formation of amorphous silicon on top of the passivation layer, and Providing a protective layer of an insulating silicon compound on the surface layer, wherein the protective cover comprising both the surface layer and the protective layer.

2. The method as claimed in claim 1, wherein the gaseous silicon compound is a silane compound.

3. The method as claimed in claim 1, wherein the protective cover is formed at a temperature in the range of 100-300° C.

4. The method as claimed claim 1, wherein the supply of the gaseous silicon species further results in an excess silicon layer on top of the copper silicide, which is thereafter at least partially converted into the protective layer.

5. The method as claimed claim 1, wherein the protective layer is a silicon oxide layer that is formed after removal of the substrate from the deposition chamber.

6. The method as claimed in claim 5, wherein the amorphous silicon is at least partially transformed into silicon oxide.

7. The method as claimed in claim 1, further comprising the step of reducing an oxide surface of the copper containing conductor to obtain the exposed surface.

8. The method as claimed in claim 6, wherein the oxide surface is reduced through supply of hydrogen into the deposition chamber, for instance in the form of molecular hydrogen, an atomic hydrogen source or as atomic hydrogen, which supply occurs either prior to or simultaneous with the supply of the gaseous silicon compound.

9. The method as claimed in claim 8, wherein the exposure and deposition is carried out as a plasma-enhanced or plasma assisted deposition process.

10. The method as claimed in claim 1, wherein the protective cover is provided in a thickness of less than 20 nanometers.

11. The method as claimed in claim 1, wherein the provision of the substrate with the copper-containing conductor comprises the steps of:
Providing an interface layer on the surface of the semiconductor substrate that is exposed in the contact areas, and
Depositing the copper-containing conductor on the interface layer.

12. The method as claimed in claim 11, wherein the interface layer contains a metal that is capable of forming a metal silicide with the underlying silicon substrate, and wherein the provision of the interface layer and the formation of the copper silicide are such that formation of a metal silicide with the silicon substrate is at least largely prevented.

13. The method as claimed in claim 11, wherein the interface layer constitutes a plating base and the copper-containing conductor is deposited in an electrochemical process.

14. The method as claimed in claim 1, wherein the substrate is provided with a passivation layer extending substantially around said interface layer, and wherein a silicon-containing layer is deposited on said passivation layer simultaneously with the provision of the protective cover.

15. The method as claimed in claim 1, wherein the substrate is provided with a patterned dielectric layer defining at least one cavity, which leaves the interface layer exposed, and wherein the copper-containing conductor is deposited into said cavity, such that the dielectric layer defines the exposed surface of the conductor onto which the protective cover is applied.

16. A solar cell comprising a semiconductor substrate provided with a passivation layer at a first side thereof, which passivation layer is patterned to define contact areas provided with a copper-containing conductor, which conductor is covered with a protective cover, which protective cover comprises a surface layer of a copper silicide and a protective layer of an insulating silicon compound.

17. The solar cell as claimed in claim 16, wherein the protective cover has a thickness of less than 20 nanometers.

18. The solar cell as claimed in claim 16, wherein the protective cover extends both on a top face and on side faces of the conductor, therewith forming an encapsulation.

19. The solar cell as claimed in claim 16, wherein the protective cover is patterned, so as to leave a predefined area of the conductor exposed, and for instance suitable for soldering or bonding.

20. The solar cell of claim 16 obtained with the method as claimed in claim 1.

* * * * *